US007946336B2

(12) United States Patent
Wang et al.

(10) Patent No.: US 7,946,336 B2
(45) Date of Patent: May 24, 2011

(54) HEAT SINK STRUCTURE

(75) Inventors: Feng-Ku Wang, Taipei (TW);
Shaw-Fuu Wang, Taipei (TW);
Ting-Chiang Huang, Taipei (TW);
Sheng-Jie Syu, Taipei (TW)

(73) Assignee: Inventec Corporation, Taipei (TW)

( * ) Notice: Subject to any disclaimer, the term of this patent is extended or adjusted under 35 U.S.C. 154(b) by 763 days.

(21) Appl. No.: 12/071,488

(22) Filed: Feb. 21, 2008

(65) Prior Publication Data

US 2009/0211729 A1    Aug. 27, 2009

(51) Int. Cl.
*F28F 7/00*    (2006.01)
(52) U.S. Cl. ..................................... 165/80.3; 165/80.2
(58) Field of Classification Search .................. 165/80.2, 165/80.3, 185
See application file for complete search history.

(56) References Cited

U.S. PATENT DOCUMENTS

| | | | | |
|---|---|---|---|---|
| 6,137,683 A * | 10/2000 | Lee et al. | ....................... | 361/704 |
| 6,447,322 B1 * | 9/2002 | Yan et al. | ....................... | 439/331 |
| 7,753,107 B2 * | 7/2010 | Zhou et al. | .................... | 165/80.3 |
| 2005/0074995 A1 * | 4/2005 | Kimura et al. | ................ | 439/159 |
| 2005/0248918 A1 * | 11/2005 | Lin | ................ | 361/687 |

* cited by examiner

*Primary Examiner* — Teresa J Walberg
(74) *Attorney, Agent, or Firm* — Rabin & Berdo, P.C.

(57) ABSTRACT

A heat sink is used for dissipating thermal energy generated by an electronic component of an electronic device. The heat sink includes a contact base and a fin base. The contact base is attached on the electronic component to transfer thermal energy, and the fin base is pivotally connected to the contact base to transfer thermal energy with the contact base. The fin base has a plurality of fins, and rotates relative to the contact base. A center of gravity of the fin base deviates from a rotation axis. When the electronic device is moved, due to the deviated center of gravity, the fin base rotates to make the fins disturb the air inside the electronic device.

7 Claims, 7 Drawing Sheets

HEAT SINK STRUCTURE

BACKGROUND OF THE INVENTION

1. Field of Invention

The present invention relates to a heat sink. More particularly, the present invention relates to a heat sink applied to a portable electronic device.

2. Related Art

Currently, with the rapid development of electronic science and technology, and the increasing attention that consumers pay to light, thin, and portable characteristics of consumable electronic products, electronic products, e.g. notebook computers, ultra mobile personal computers (UMPC), PDAs, and other portable electronic devices, are gradually developed toward miniaturization. For users who often travel outside, the portable electronic products are more convenient to carry, thus greatly improving the convenience in use.

However, the rapid operation speed of the electronic components inside the computer device, and the small volume of the electronic components incur a higher thermal energy generation amount per units. If the generated thermal energy cannot be dissipated in time, the over-high temperature will seriously influence the stability and efficiency of the electronic components in operation, and even reduce the service life of the computer device or cause damage to the computer device.

For example, small-sized portable electronic devices such as flat panel computers and UMPCs are fabricated to be light, thin, and portable, so as to cater for the consumers' demands for the small-sized computer devices. Therefore, it is difficult to install an additional heat sink fan in the portable computer device with limited free space. Consequently, the portable computer device without the design of fan cannot utilize the forced convection of air, and relies only on the natural convection and thermal radiation between the heat sink and the air to dissipate thermal energy, and thus the thermal dissipation effect is unsatisfactory, and cannot meet the thermal dissipation requirements of the portable electronic apparatus with high operation speed.

In order to solve the thermal dissipation problem of the portable computer device, the conventional method reduces the operating frequency of the electronic components, such as central processing units (CPU), so as to prevent the generation of too much thermal energy. Or, the conventional method increases the thermal dissipation surface area of the computer device, so as to dissipate the thermal energy generated by the electronic components from the computer device via the thermal dissipation surface of large area.

Although the thermal energy generated by the portable computer device in operation may be reduced by lowering the operating frequency of the electronic components, the overall performance of the computer device is influenced, which does not meet the demands of the consumers for high operating performance of the electronic products. Also, the thermal dissipation of the electronic device relying only on the natural convection and thermal radiation is insufficient.

The increased thermal dissipation surface area for dissipating thermal energy leads to the increase of the overall volume of the computer device, such that the portable computer device cannot be miniaturized, which is against the current trend of light, thin, short, and small electronic products in the market.

SUMMARY OF THE INVENTION

In view of the above problems, the present invention provides a heat sink, for solving the problem of the conventional heat sink device applied to the portable electronic device that the overall thermal dissipation performance is poor since in accordance with the circuit layout of the electronic device, only the heat sink surface in contact with the air is used to dissipate thermal energy in the manner of natural convection, and the fan cannot be used for dissipating thermal energy.

The heat sink of the present invention is disposed in an electronic device, so as to perform thermal exchange with an electronic component of the electronic device. The heat sink includes a contact base and a fin base. The contact base is attached on the electronic component to transfer thermal energy, and the fin base is pivotally connected to the contact base to transfer thermal energy with the contact base. The fin base has a plurality of fins, and rotates about a rotation axis serving as a center of axis relative to the contact base. A center of gravity of the fin base deviates from the rotation axis. When the electronic device is moved, due to the deviated center of gravity, the fin base rotates to make the fins disturb the air inside the electronic device.

The heat sink of the present invention utilizes the displacement such as inclination or swing generated when the electronic device is operated to make the fin base with its center of gravity deviating from the rotation axis to rotate, thereby disturbing the air inside the electronic device and improving the thermal cycling performance, such that the thermal energy generated by the electronic component can be dissipated quickly. The present invention solves the problem of the conventional heat sink applied to the portable electronic device that the overall thermal dissipation performance is poor since a forced airflow cannot be generated for exchanging thermal.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below for illustration only, and thus are not limitative of the present invention, and wherein.

DETAILED DESCRIPTION OF THE INVENTION

The heat sink provided by the present invention is used to dissipate the thermal energy generated by the electronic device such as an UMPC, a personal computer, a notebook computer, a PDA, but not limit to the above-mentioned portable electronic devices. In the following detailed description of the present invention, UMPC is taken as a preferred embodiment of the present invention, and the accompanying drawings are used to provide reference and illustration, and not intended to limit the present invention.

Figure 1:
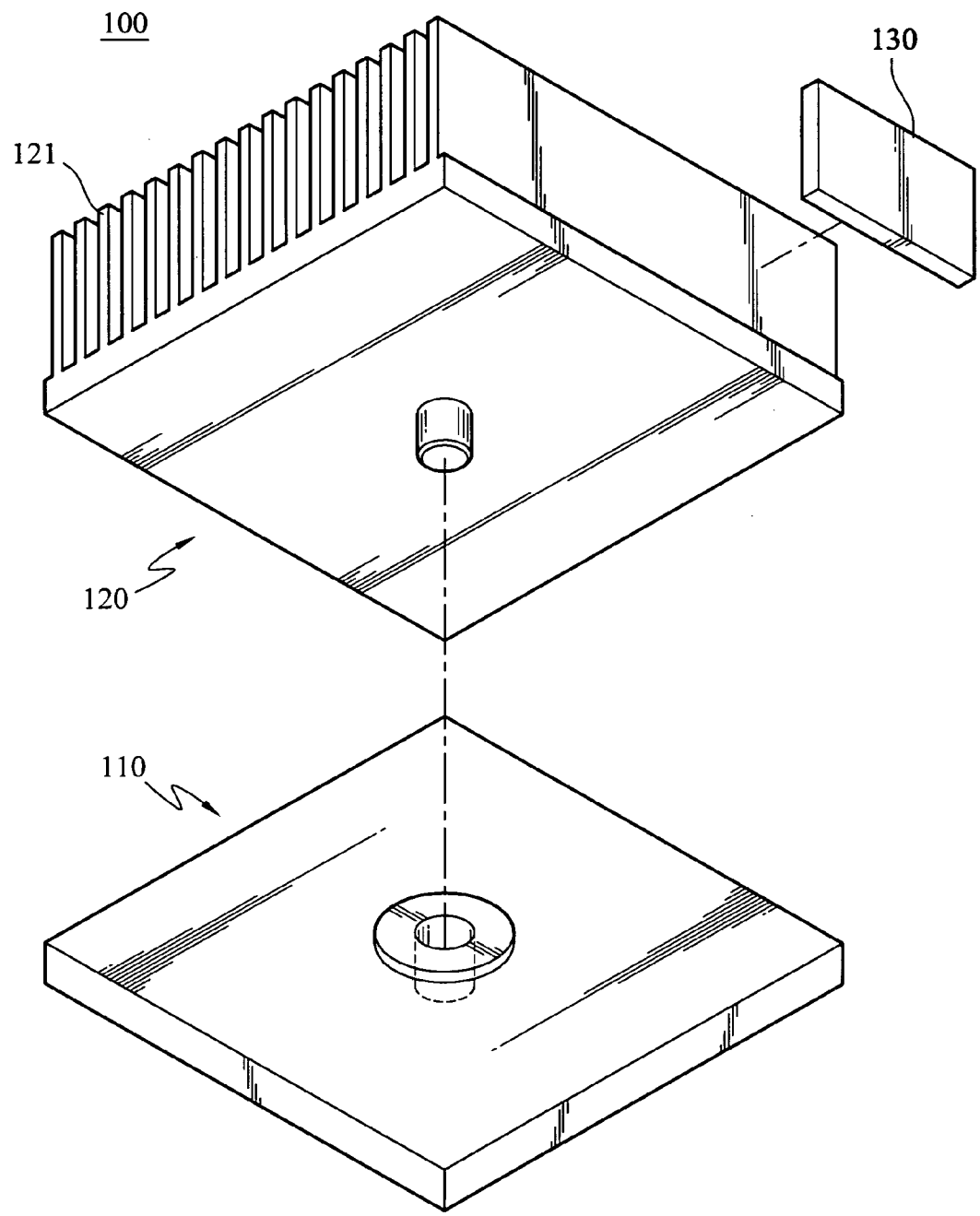
FIG. 1 is an exploded view of a heat sink of the present invention.

FIG. 1 is an exploded view of a heat sink of the present invention. A heat sink 100 of the present invention includes a contact base 110, a fin base 120, and a balance weight 130. The shape of the heat sink 100 provided by the present invention is rectangular, similar to that of the conventional heat sink. The contact base 110 is attached on an electronic component (not shown), and the fin base 120 is pivotally connected to the contact base 110, so as to transfer thermal energy with the contact base 110. The fin base 120 has a plurality of fins 121 vertically disposed on the fin base 120 at the other side opposite to the contact base 110. The fin base 120 rotates about an axis direction perpendicular to the pivoted plane of the contact base 110 as the rotation axis.

The balance weight 130 is disposed on periphery of the fin base 120, for example, on an outmost fin 121, such that the center of gravity of the fin base 120 deviates from the rotation axis. With the balance weight 130, the fin base 120 may rotate relative to the contact base 110, so as to generate a disturbed airflow.

Figure 2:
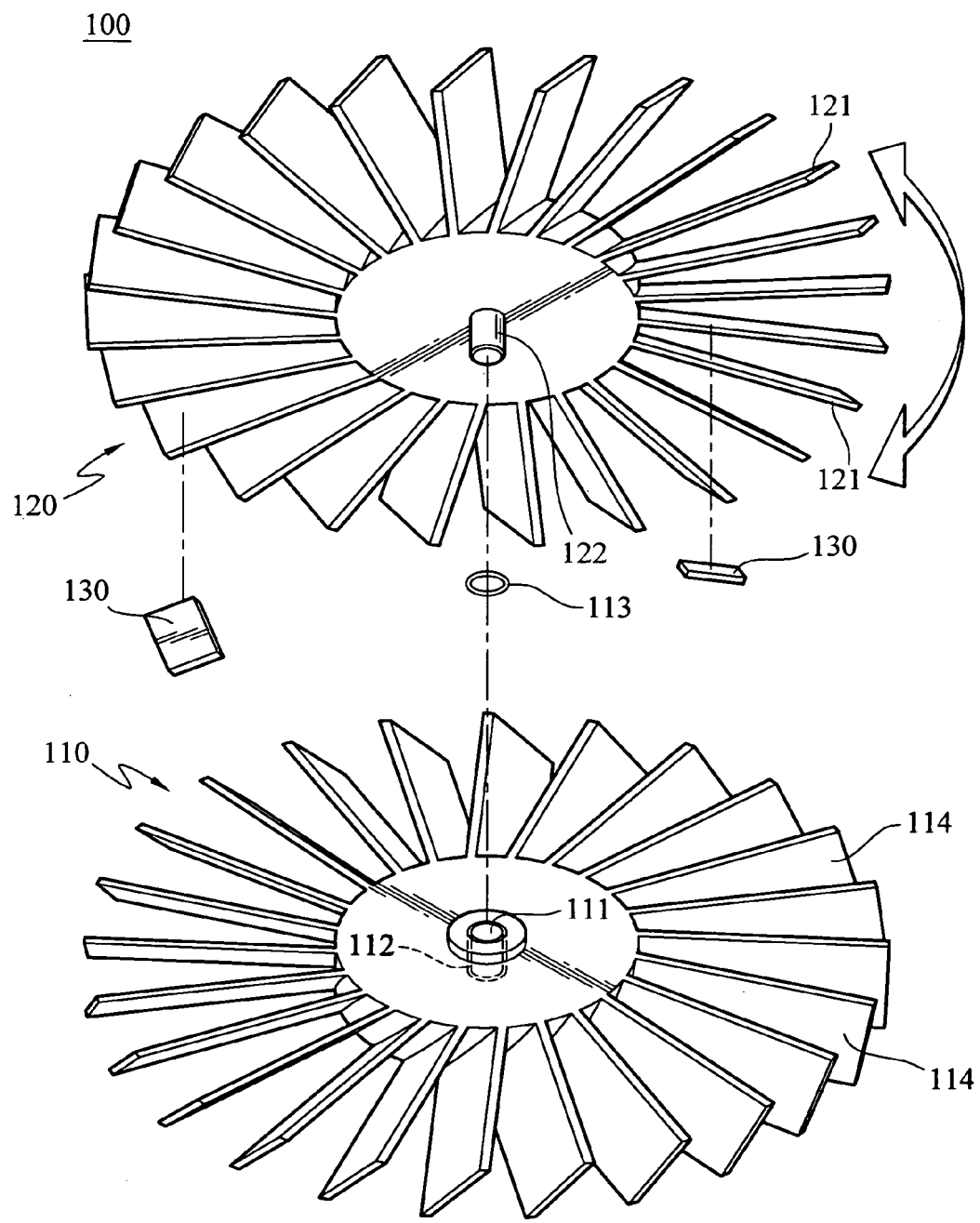
FIG. 2 is an exploded view of a first embodiment of the present invention.
Figure 3:
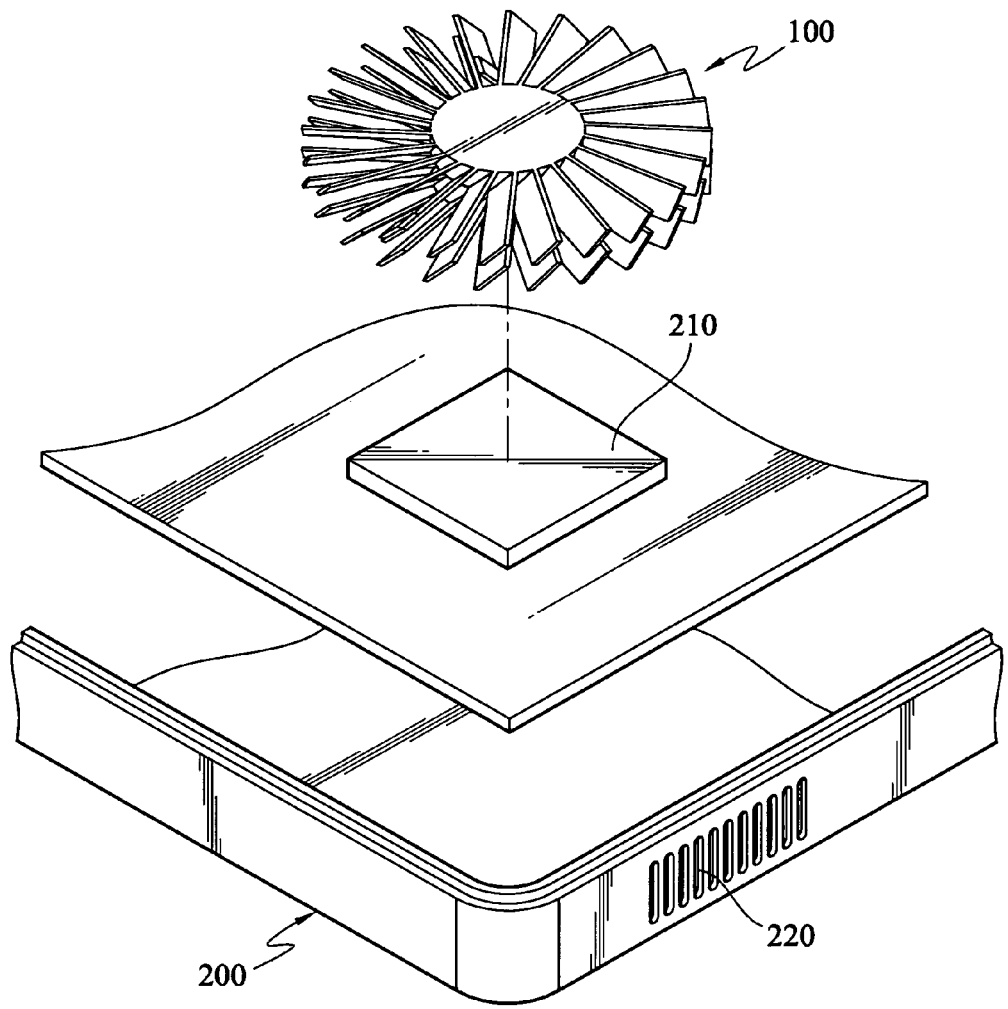
FIG. 3 is a perspective view of the first embodiment of the present invention.
Figure 4:
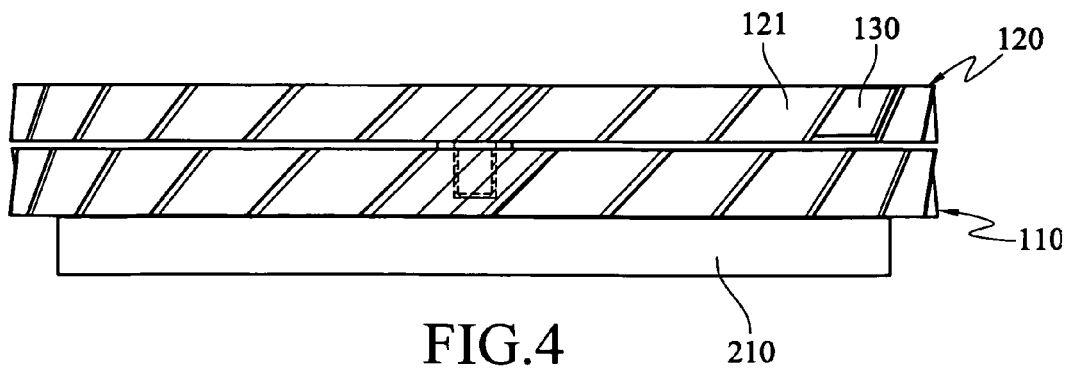
FIG. 4 is a side view of the first embodiment of the present invention.

Referring to FIGS. 2 to 4 of the first embodiment of the present invention, the heat sink of the first embodiment of the present invention changes the shape of the fin base to achieve the optimal thermal dissipation performance according to the practical thermal dissipation requirement without departing from the spirit and scope of the present invention. The heat sink 100 of the first embodiment of the present invention is disposed in an electronic device 200, so as to perform thermal exchange with an electronic component 210 of the electronic device 200. The electronic component 200 may be a chip, CPU, and other electronic parts generating high thermal energy in operation.

The heat sink 100 of the first embodiment of the present invention includes a contact base 110 and a fin base 120. One side of the contact base 110 is attached on the electronic component 210, for conducting the thermal energy generated by the electronic component 210. A pivot hole 111 is formed on the contact base 110 at the other side opposite to the electronic component 210. A thermal transfer medium 112 is filled in the pivot hole 111. The thermal transfer medium 112 may be, but not limited to, a fluid with good thermal conductivity such as lubricating oil or water.

A plurality of fins 121 extend from the periphery of the fin base 120. A pivot 122 corresponding to the pivot hole 111 is disposed on one side of the fin base 120, and the pivot 122 is inserted in the pivot hole 111. A sealing ring 113 seals and encapsulates the pivot hole 111 and the pivot 122, so as to make the fin base 120 to be pivotally connected to the contact base 110. The fin base 120 transfers thermal energy with the contact base 110 through the thermal transfer medium 112, and rotates about the axis direction perpendicular to the pivoted plane of the contact base 110 as the rotation axis relative to the contact base 110.

Besides contacting the fin base 120 and the contact base 110 to transfer thermal energy, a thermal transfer medium 112 further provides a thermal transfer path from the contact base 110 to the fin base 120, and lubricates the pivot 122 of the fin base 120, such that the heat sink 100 of the present invention have better thermal transfer effect.

Please refer to FIG. 2 to FIG. 4, the heat sink 100 of the first embodiment of the present invention further includes two balance weights 130 respectively disposed on the fins 121 on the two opposite sides of the fin base 120, such that the center of gravity of the fin base 120 originally located at the center deviates from the rotation axis. When operating the portable electronic device 200, in most circumstance, the user holds the electronic device 200 in hands. However, the hand held operating manner is less stable than the manner of operating on the plane, such that the electronic device 200 produces slight vibrating or shaking, etc. The fin base 120 with the center of gravity deviating from the rotation axis rotates along with the move of the electronic device 200, so as to produce an airflow to disturb the air inside the electronic device 200, and exchange thermal with the outside air through a vent 220 of the electronic device 200, thereby increasing the thermal cycling performance inside the electronic device 200. Moreover, the disturbed airflow can also exchange thermal energy with the outside air through seams, sound amplifier port, electrical connection hole, and other preset holes of the case of the electronic device 200.

Each fin 121 is disposed on periphery of the fin base 120 an angle inclined to the rotation axis, so as to increase the contact area between the airflow and the fin 121 when the disturbed airflow is generated, and fits the flowing direction of the disturbed airflow to achieve better thermal exchange effect. The periphery of the contact base 110 attached with the electronic component 210 extends to form a plurality of fixed fins 114, so as to increase the contact area with the atmosphere, thereby facilitating the dissipation of the thermal energy transferred to the heat sink 100.

Figure 5:
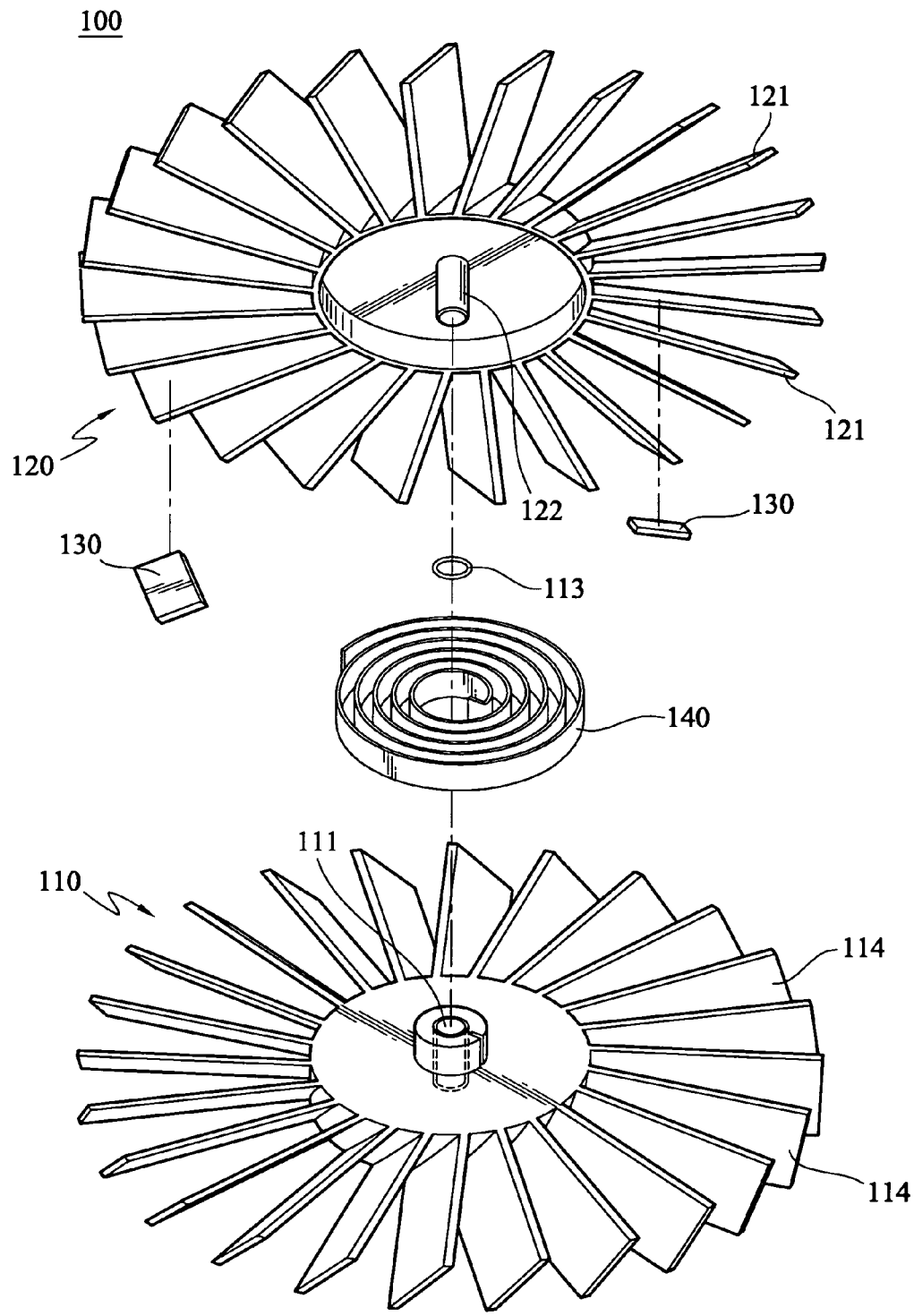
FIG. 5 is an exploded view of a second embodiment of the present invention.
Figure 6:
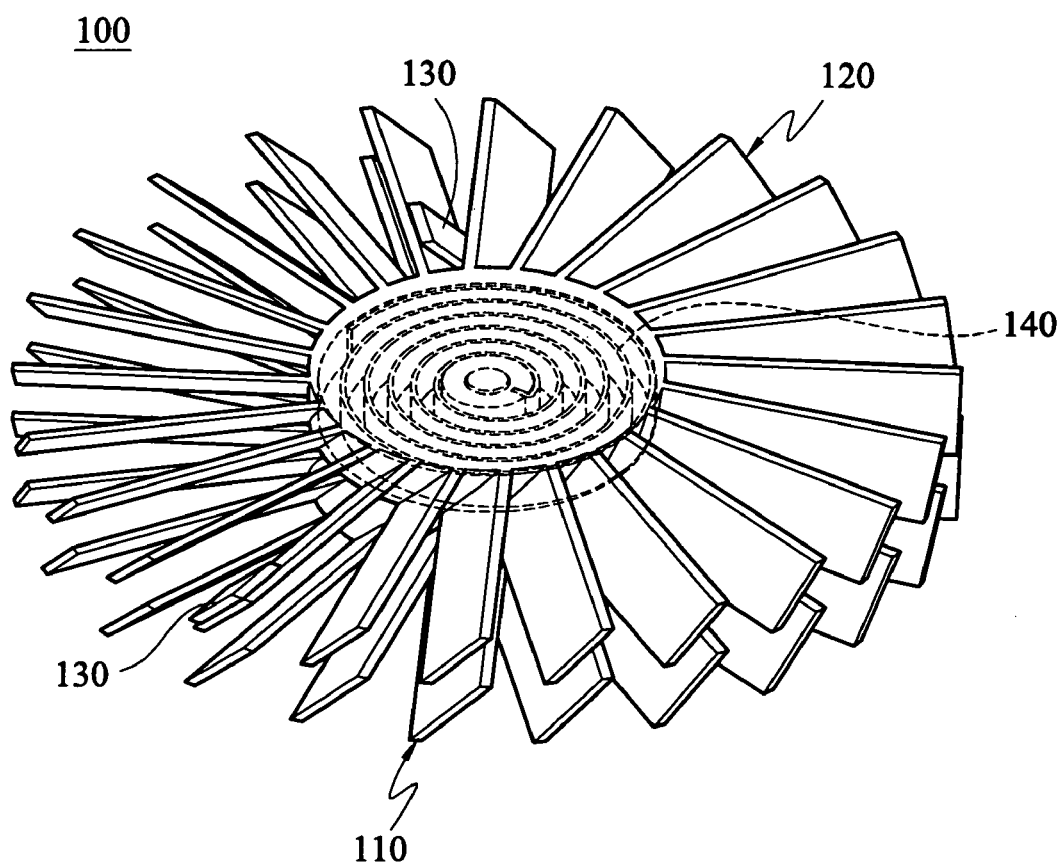
FIG. 6 is a perspective view of the second embodiment of the present invention.

FIGS. 5 and 6 are schematic views of a second embodiment of the present invention. The heat sink 100 of the second embodiment of the present invention further includes an elastic member 140 disposed between the contact base 110 and the fin base 120. The elastic member 140 is a reel flat spring with one end connected to the contact base 110 and the other end connected to the fin base 120. When the fin base 120 rotates under the action of the electronic device 200, the elastic member 140 provides an elastic force to make the fin base 120 rotates repeatedly within a certain range, so as to generate a disturbed airflow.

Figure 7:
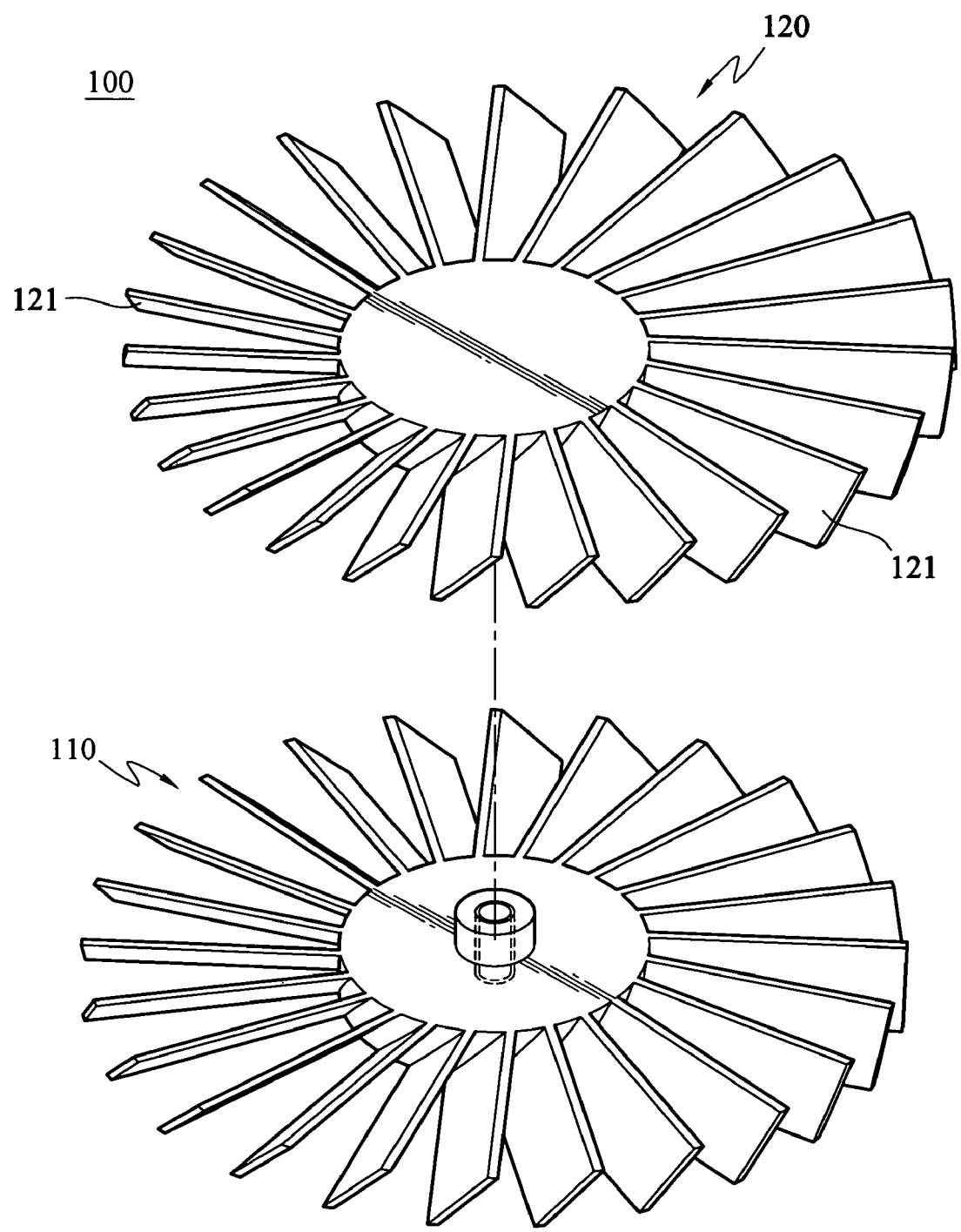
FIG. 7 is an exploded view of different types of the fin base of the present invention.
Figure 8:
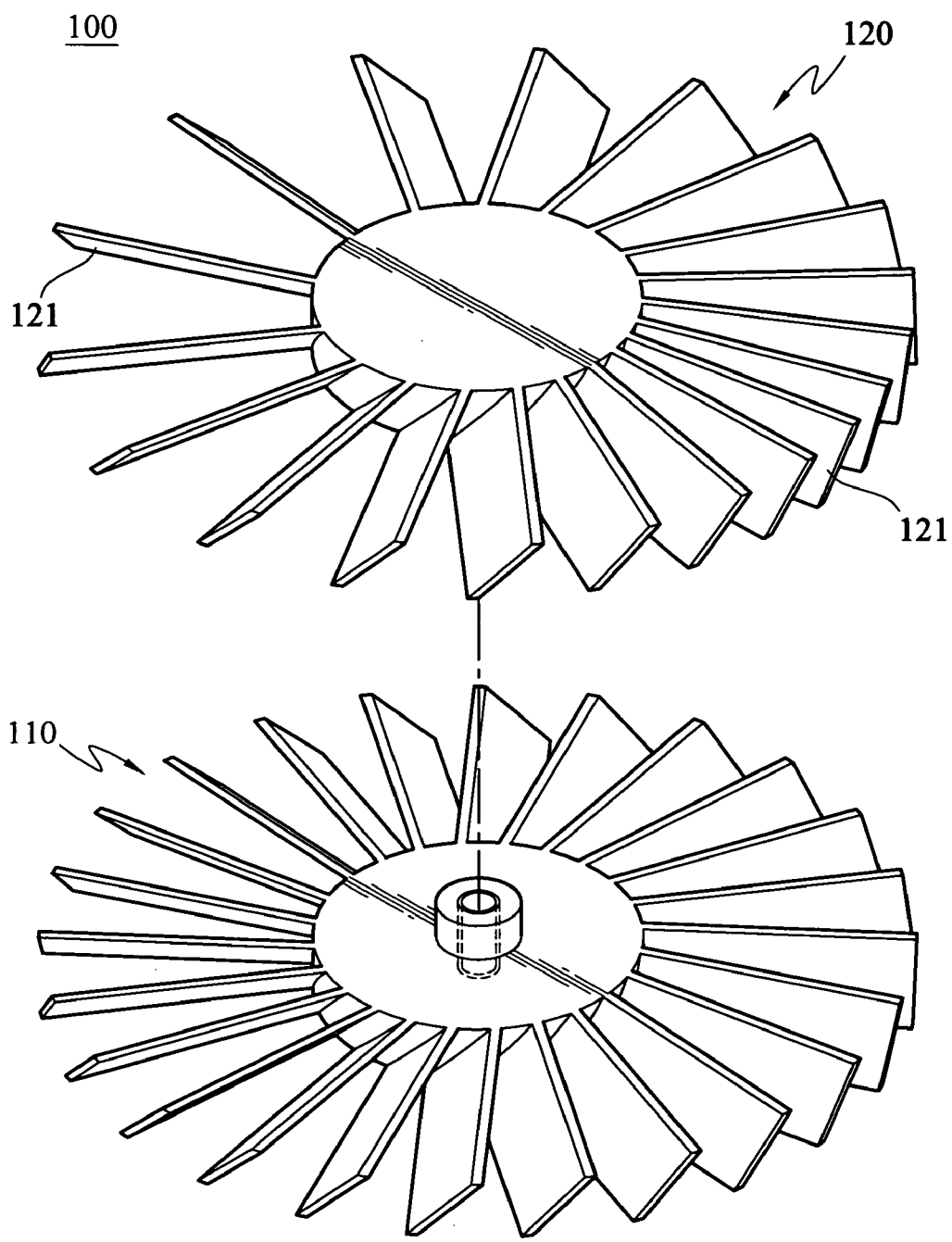
FIG. 8 is an exploded view of different types of the fin base of the present invention.

FIGS. 7 and 8 are schematic views of different types of the fin base of the present invention. Referring to FIGS. 7 and 8, the fins 121 located on two opposite sides of the fin base 120 have different lengths, such that the fin base 120 forms an asymmetric structure. Or, the numbers of the fins 121 disposed on two opposite sides of the fin base 120 are not equal, such that the fin base 120 forms an asymmetric structure. Through the asymmetric design of the fin 121, the center of gravity of the fin base 120 deviates from the rotation axis. Thus, when the user operates the electronic device (not shown), the fin base 120 rotates relative to the contact base 110 along with the action of the electronic device.

Compared with the conventional art, the heat sink of the present invention utilizes the displacement such as inclination or swing generated when the electronic device is operated to make the fin base with the center of gravity deviating from the rotation axis to rotate, thereby disturbing the air inside the electronic device and improving the thermal cycling performance, such that the thermal energy generated by the electronic components can be dissipated quickly.

The present invention solves the problem of the conventional heat sink applied to the portable electronic device that the overall thermal dissipation performance is poor since only the natural convection with the air is utilized to dissipate thermal energy, and the forced airflow cannot be generated for exchanging thermal.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A heat sink, disposed in an electronic device, for performing thermal exchange with an electronic component of the electronic device, comprising:
   a contact base, attached on the electronic component to transfer thermal energy; and
   a fin base, pivotally connected to the contact base to transfer thermal energy with the contact base, wherein the fin base has a plurality of fins, and rotates about a rotation axis serving as a center of axis relative to the contact base, and a center of gravity of the fin base deviates from the rotation axis, such that when the electronic device is moved, the fin base is driven by the deviated center of gravity to rotate, so as to disturb air inside the electronic device.

2. The heat sink as claimed in claim 1, further comprising at least one balance weight disposed on the fin base, so as to make the center of gravity of the fin base deviate from the rotation axis.

3. The heat sink as claimed in claim 1, wherein the fin base is of an asymmetric structure, so as to make the center of gravity of the fin base deviate from the rotation axis.

4. The heat sink as claimed in claim 1, wherein a pivot hole is formed on the contact base at the other side opposite to the electronic component, the pivot hole has a thermal transfer medium, a pivot is disposed on one side of the fin base, and the pivot is inserted into the pivot hole, such that the fin base is pivotally connected to the contact base.

5. The heat sink as claimed in claim 1, further comprising an elastic member disposed between the contact base and the fin base, one end of the elastic member being connected to the contact base, and the other end of the elastic member being connected to the fin base, such that the fin base rotates repeatedly relative to the contact base.

6. The heat sink as claimed in claim 1, wherein the fins are disposed at an angle inclined to the rotation axis.

7. The heat sink as claimed in claim 1, wherein a plurality of fixed fins further extends from the contact base.

* * * * *